(12) United States Patent
Que et al.

(10) Patent No.: US 11,699,945 B2
(45) Date of Patent: Jul. 11, 2023

(54) DRIVE CIRCUIT AND SWITCHING POWER SUPPLY DEVICE

(71) Applicant: TDK CORPORATION, Tokyo (JP)

(72) Inventors: Sheng Hao Que, Wuxi (CN); Lian Wen Zou, Wuxi (CN); Qing Lu Qin, Wuxi (CN)

(73) Assignee: TDK CORPORATION, Tokyo (JP)

(*) Notice: Subject to any disclaimer, the term of this patent is extended or adjusted under 35 U.S.C. 154(b) by 62 days.

(21) Appl. No.: 17/406,633

(22) Filed: Aug. 19, 2021

(65) Prior Publication Data
US 2022/0060099 A1 Feb. 24, 2022

(30) Foreign Application Priority Data
Aug. 20, 2020 (CN) .......................... 202010841782.7

(51) Int. Cl.
*H02M 1/08* (2006.01)
*H02M 1/00* (2006.01)
*H02M 3/335* (2006.01)

(52) U.S. Cl.
CPC ........... *H02M 1/08* (2013.01); *H02M 1/0054* (2021.05); *H02M 3/33573* (2021.05)

(58) Field of Classification Search
CPC ............... H02M 1/08; H02M 3/33573; H02M 3/33584; H03K 17/691
See application file for complete search history.

(56) References Cited

U.S. PATENT DOCUMENTS

| 4,792,746 A * | 12/1988 | Josephson | ........ H03K 17/04123 |
| | | | 327/420 |
| 10,361,698 B2 * | 7/2019 | Chandrasekaran | .. H03K 17/567 |
| 11,502,593 B2 * | 11/2022 | Warnes | ............. H02M 3/33553 |

FOREIGN PATENT DOCUMENTS

JP  H02-116134 U  9/1990

* cited by examiner

*Primary Examiner* — Kyle J Moody
(74) *Attorney, Agent, or Firm* — Oliff PLC

(57) ABSTRACT

A drive circuit driving a first switching element, including: a first diode with a cathode terminal connected to a first switching element gate terminal; a second switching element with a first terminal connected to a first diode anode terminal, a second terminal connected to a first switching element gate terminal, a third terminal connected to a first switching element source terminal; a third switching element with a drain terminal connected to the first diode anode terminal, and a source terminal connected to the first switching element source terminal; a parallel circuit; and a drive transformer having a coil, one end connected to the drain terminal, the other end connected to the third switching element gate terminal, and connected to the third switching element source terminal, one end of the parallel circuit connected to one coil end, the second diode cathode terminal connected to the other end of the coil.

20 Claims, 11 Drawing Sheets

DRIVE CIRCUIT AND SWITCHING POWER SUPPLY DEVICE

FIELD

The present invention relates to a drive circuit for driving a main switching element and a switching power supply device that performs power conversion by a main switching element being turned on and off at a predetermined frequency.

BACKGROUND

As the core component of switching power supply, MOS-FET is widely used in DC/DC converters because it has the advantages of voltage-driven, high operating frequency, and no current tailing during turn-off. With the development of miniaturization, modularization, and high-power-density switching power supplies, the requirements for efficiency indicators are constantly improving. A new generation of high-speed superjunction MOSFETs are also being continuously introduced, and the on-resistance, as a key parameter to reduce loss, is also getting lower and lower, however, another performance parameter of MOSFET, i.e. the input capacitance increases with the increase of its capacity, a larger input capacitance will slow down the turn-off speed of the MOSFET, resulting in an increase in turn-off loss. Therefore, in practical applications, power supply designers need to consider the circuit design of turning-off MOSFET.

Therefore, the design requirements for a reliable driving circuit for the main switching element with a large input capacitance are proposed. For high-power modules, full-bridge and half-bridge circuit topologies are generally used. One way to drive a pair of upper and lower FET is to use a specific drive chip, but such chips are usually expensive, the design is more complicated, and the turn-on and turn-off delays are relatively large. Another way is to use transformer coupling, which has the advantages of small delay, low price, flexible design, etc., and the voltage can be adjusted at any time (flexibly adjusted) by the design of the transformation ratio. Therefore, it is also a scheme that is currently used more frequently. The present invention is also a new type of drive circuit based on the transformer coupling mode. Of course, it is also applicable to the application on the drive circuit with a specific drive chip, so it has a wide range of applications.

For example, in Patent Document 1, as shown in FIG. 11, a MOS-FET gate drive device includes: a pulse transformer for electrical insulation; a diode for half-wave rectification on the secondary side of the pulse transformer; a resistor connected in series to the diode and used to determine the on/off time constant of the MOS-FET; a PNP transistor, the emitter of which is connected to the cathode side of the diode, the collector of which is connected to the source side of the MOS-FET, and the base of which is connected to the anode side of the diode. A resistor for limiting base current is connected between the base and the collector of the transistor. By this gate drive device, the charge stored in the input capacitance of the MOS-FET is quickly discharged through the transistor Q2, so that the turn-off time can be shortened and the turn-off loss can be reduced. However, in order to increase the turn-off speed of the power switch in the circuit of Patent Document 1, it is necessary to increase the resistance of the current limiting resistor R1 and reduce the time constant determination resistor R2. As a result, the turn-off loss can be reduced. However, when the drive transformer is reset in the reverse direction, since no resistor is added to limit the current, a larger reset current flows in the PNP transistor Q2, and even the PNP transistor Q2 is damaged. Therefore, Patent Document 1 is only suitable for applications where the input drive signal is a unidirectional pulse, so its application has limitations.

CITATION LIST

Patent Document

Patent Document 1: JPH2-116134U

SUMMARY

The present invention has been completed in view of the above-mentioned problems, and its object is to provide a drive device for a semiconductor switching element capable of quickly discharging the charge stored in the input capacitance of a MOS-FET and having a small loss. In addition, the purpose of the present invention is not only to drive the main switching elements with large input capacitance at high speed and reliably, but also to reduce the power consumption of the drive circuit. It can also be applied to the occasions where AC pulses are driven, so it is also suitable for full-bridge and half-bridge circuits with isolation transformer driving applications. In addition, it can also be applied when the drive signal is a positive pulse, and it can also work in a circuit that drives a single main switching element. Therefore, the circuit of the present invention has wider practical applicability.

The drive circuit of the present invention is a drive circuit configured to drive the first switching element, comprising: a first diode, a cathode terminal of which is connected to a gate terminal of a first switching element; a second switching element, a first terminal of which is connected to an anode terminal of the first diode, a second terminal of which is connected to a gate terminal of the first switching element, a third terminal of which is connected to a source terminal of the first switching element; a third switching element, a drain terminal of which is connected to the anode terminal of the first diode, and a source terminal of which is connected to the source terminal of the first switching element; a parallel circuit, one end of which is connected to a cathode terminal of a Zener diode and one end of a capacitor, and the other end is connected to an anode terminal of the Zener diode and the other end of the capacitor; and a drive transformer having a coil, one end of the coil is connected to the drain terminal of the third switching element via the parallel circuit, the other end of the coil is connected to the gate terminal of the third switching element, and is connected to the source terminal of the third switching element via a second diode, one end of the parallel circuit is connected to one end of the coil, a cathode terminal of the second diode is connected to the other end of the coil, at least one of the connection between the second terminal and the gate terminal of the first switching element and the connection between the third terminal and the source terminal of the first switching element is connected via a resistor.

According to the drive circuit of the present invention, even if the input capacitance between the gate and the source of the main switching element of the switching power supply device becomes large, the charge stored in the input capacitance can be quickly discharged, and the loss of the semiconductor switching element can be reduced.

In addition, in the drive circuit of the present invention, preferably, the second switching element is a PNP-type bipolar transistor, the first terminal is a base terminal, the third terminal is a collector terminal, and the second terminal is an emitter terminal. Thus, it is possible to reduce the cost of the drive circuit by using an inexpensive PNP-type bipolar transistor.

In addition, in the drive circuit of the present invention, preferably, the second switching element is a P-channel type FET, the first terminal is a gate terminal, the third terminal is a drain terminal, and the second terminal is a source terminal. Thus, it is possible to achieve miniaturization and high reliability of the drive circuit by using a P-channel type FET with high reliability and a small size.

In addition, in the drive circuit of the present invention, preferably, a first resistance element is connected between the gate terminal of the first switching element and the second terminal of the second switching element. Thus, the discharge speed of the charge stored in the input capacitance of the first switching element can be adjusted by the first resistance element, and the operating point of the second switching element can be stabilized.

In addition, in the drive circuit of the present invention, a second resistance element is connected between the source terminal of the first switching element and the third terminal of the second switching element. Thus, it is possible to adjust the discharge speed of the charge stored in the input capacitance of the first switching element according to the second resistance element.

In addition, in the drive circuit of the present invention, preferably, a third resistance element is connected between the gate terminal of the third switching element and the other end of the coil. Thus, the third resistance element can provide an effect of adjusting the rising speed of the gate-source voltage of the third switching element.

In addition, in the drive circuit of the present invention, preferably, a fourth resistance element is connected between the gate terminal and the source terminal of the third switching element. Thus, the fourth resistance element can discharge the gate-source voltage of the third switching element or suppress the surge current, thereby achieving the effect of protecting the third switching element.

In addition, in the drive circuit of the present invention, preferably, a second capacitor is connected between the gate terminal and the source terminal of the third switching element. Thus, the effect of noise suppression can be enhanced by the second capacitor.

In addition, in the drive circuit of the present invention, preferably, a fifth resistance element is connected between the gate terminal and the source terminal of the first switching element. Thus, the effect of protecting the gate-source of the first switching element can be achieved by the fifth resistance element.

In addition, in the drive circuit of the present invention, preferably, a sixth resistance element is connected between the one end of the parallel circuit and the one end of the coil. Thus, the sixth resistance element can provide an effect of adjusting the rising speed of the gate-source voltage of the first switching element.

In addition, another object of the present invention is to provide a switching power supply device including any one of the above-mentioned drive circuits.

Advantageous Effects of the Invention

According to the drive circuit and the switching power supply of the present invention, when the secondary voltage of the drive transformer is reversed, by turning on the third switching element, the charge stored in the input capacitance of the first switching element can be quickly discharged through the second switching element, thereby achieving high-speed turn-off. Therefore, the effect of reducing turn-off loss is achieved. This turn-off current all flows through the second and third switching elements, no current flows through the isolation transformer and the driving IC, which can significantly reduce the power consumption and temperature rise of the driving IC and the transformer. At the same time, it is possible to design the parameters of the first resistance element and the second resistance element to facilitate reliable and fast turn-off of MOSFETs with different input capacitances, so as to achieve the purpose of simple design.

DETAILED DESCRIPTION OF THE EMBODIMENT(S)

Hereinafter, a switching power supply device 1 according to an embodiment of the present invention will be described with reference to the accompanying drawings.

Figure 1:
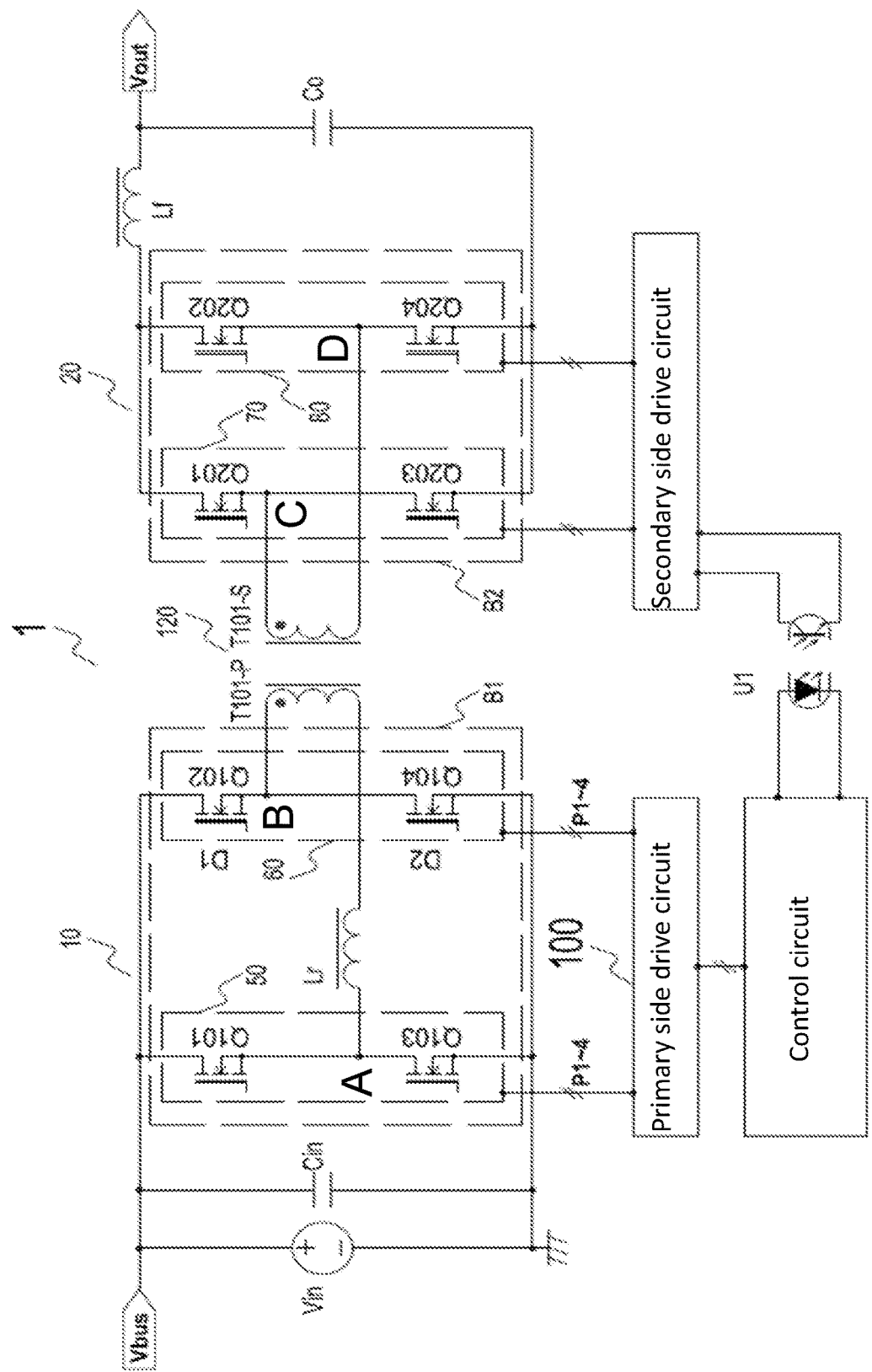
FIG. 1 is a circuit diagram of a switching power supply device according to an embodiment of the present invention.

FIG. 1 is a circuit diagram of a switching power supply device according to an embodiment of the present invention. The switching power supply device 1 includes a full bridge circuit in each of the primary side circuit 10 and the secondary side circuit 20, and is connected via an insulating transformer (transformer) 120. The transformer has a primary coil and a secondary coil.

The primary side circuit 10 includes a primary side bridge circuit B1, an input capacitor Cin and an inductor Lr connected to the primary side bridge circuit B1.

The secondary side circuit 20 includes a secondary side bridge circuit B2, an inductor Lf and a smoothing capacitor Co connected to the secondary side bridge circuit B2.

The primary side bridge circuit B1 includes a first switching element Q101, a second switching element Q103, a third switching element Q102, and a fourth switching element Q104. The primary side bridge circuit B1 has a first bridge arm 50 and a second bridge arm 60. The first bridge arm 50 includes the first switching element Q101 and the second switching element Q103. A first connection point A between the first switching element Q101 and the second switching element Q103 is connected to one end of the primary coil of the transformer 120 via an inductor Lr. The second bridge arm 60 includes the third switching element Q102 and the fourth switching element Q104. A second connection point B between the third switching element Q102 and the fourth switching element Q104 is connected to the other end of the primary coil of the transformer 120.

The secondary side bridge circuit B2 includes a fifth switching element Q201, a sixth switching element Q203, a seventh switching element Q202, and an eighth switching element Q204. The secondary bridge circuit B2 has a third bridge arm 70 and a fourth bridge arm 80. The third bridge arm 70 includes the fifth switching element Q201 and the sixth switching element Q203. A third connection point C between the fifth switching element Q201 and the sixth switching element Q203 is connected to one end of the secondary coil of the transformer 120. The fourth bridge arm 80 includes the seventh switching element Q202 and the eighth switching element Q204. A fourth connection point D between the seventh switching element Q202 and the eighth switching element Q204 is connected to the other end of the secondary coil of the transformer 120. In this embodiment, each of the switching elements Q101 to Q104 and Q201 to Q204 is constituted by a MOSFET (metal-oxide semiconductor field-effect transistor), but may also be constituted by other switching elements such as an IGBT (insulated gate bipolar transistor).

Figure 2:
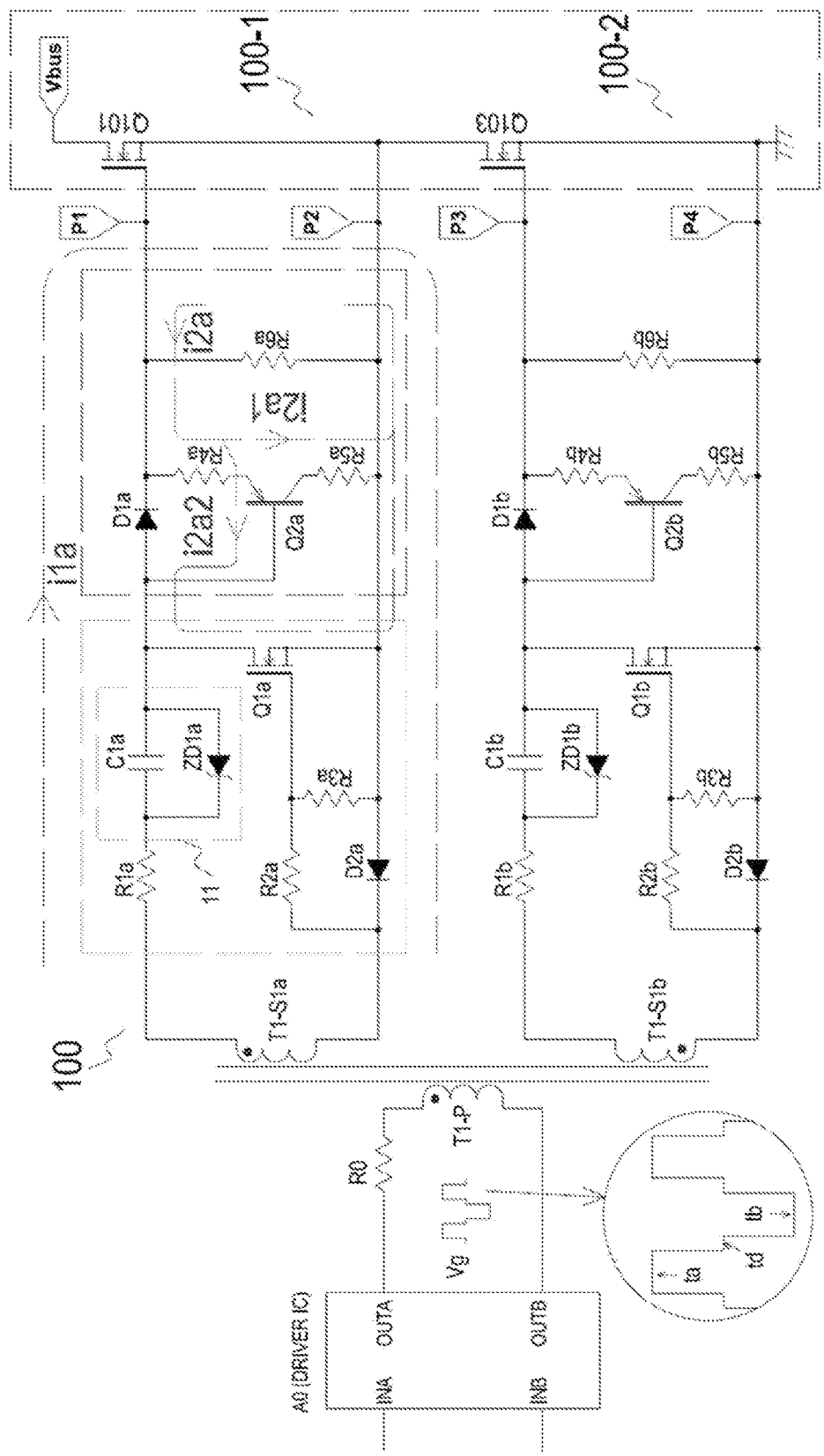
FIG. 2 is a circuit diagram of a drive circuit of a main switching element (first switching element) of the switching power supply device according to an embodiment of the present invention.

FIG. 2 is a circuit diagram of a drive circuit of the main switching element of the switching power supply according to the present embodiment. As shown in FIG. 2, the drive circuit 100 has a series circuit of a primary coil T1-$p$ of a drive transformer T1 and an input resistance R0 connected to a signal source (drive IC, etc.) that generates an AC pulse signal Vg on the primary side of the drive transformer T1.

On the secondary side of the drive transformer T1, the drive units 100-1 and 100-2 of the main switching elements Q101, Q103 are connected to the secondary coils T1-S1$a$ and T1-S1$b$, respectively, and its output is connected between the gate-source terminals of the main switching elements Q101, Q103. In addition, the secondary coils T1-S1$a$ and T1-S1$b$ have the same number of turns, and the drive units 100-1 and 100-2 of the main switching elements Q101 and Q103 also have the same circuit structure, but are connected in a manner that the opposite polarities of the secondary coils T1-S1$a$ and T1-S1$b$ are reversed (Here, the polarity of the primary coil T1-$p$ and the secondary coil T1-S1$a$ are the same). In addition, since the drive circuits of the main switching elements Q102 and Q104 are the same, the description is omitted here.

The drive unit 100-1 of the main switching element includes a first diode D1$a$, a cathode terminal of which is connected to a gate terminal of the main switching element Q101 (first switching element); a PNP-type bipolar transistor (second switching element) Q2$a$, a base terminal (first terminal) of which is connected to an anode terminal of the first diode D1$a$, an emitter terminal (second terminal) of which is connected to the gate terminal of the main switching element Q101, and a collector terminal (third terminal) of which is connected to a source terminal of the main switching element Q101; a third switching element Q1$a$, a drain terminal of which is connected to the anode terminal of the first diode D1$a$, and a source terminal of which is connected to the source terminal of the main switching element Q101; a parallel circuit 11, one end of which is connected to a cathode terminal of the Zener diode ZD1$a$ and one end of a capacitor C1$a$, and the other end is connected to an anode terminal of the Zener diode ZD1$a$ and the other end of the capacitor C1$a$; and a coil T1-S1$a$, one end of the coil T1-S1$a$ is connected to the drain terminal of the third switching element Q1$a$ via the parallel circuit 11, the other end of the coil T1-S1$a$ is connected to the gate terminal of the third switching element Q1$a$, and is connected to the source terminal of the third switching element Q1$a$ via a second diode D2$a$. One end of the parallel circuit 11 is connected to one end of the coil T1-S1$a$, and the cathode terminal of the second diode D2$a$ is connected to the other end of the coil T1-S1$a$.

Although the second switching element Q2$a$ has been described as a PNP-type bipolar transistor, a P-channel type FET may also be used. When the second switching element is used as a P-channel type FET, the first terminal is a gate terminal, the third terminal is a drain terminal, and the second terminal is a source terminal.

In addition, a first resistance element R4$a$ may be connected between the gate terminal of the main switching element Q101 and the second terminal of the second switching element Q2$a$. In addition, a second resistance element R5$a$ may be connected between the source terminal of the main switching element Q101 and the third terminal of the second switching element Q2$a$. The discharge speed of the electric charge accumulated in the input capacitance of the main switching element Q101 can be adjusted by using the first resistance element R4$a$ and the second resistance element R5$a$, and the operating point of the second switching element Q2$a$ can be stabilized.

In addition, the third resistor R2$a$ may be connected between the gate terminal of the third switching element Q1$a$ and the other end of the coil T1-S1$a$. In addition, the sixth resistor R1$a$ may be connected between one end of the parallel circuit and one end of the coil T1-S1$a$. The rising speed of the gate-source voltage of the main switching element Q101 and the third switching element Q1$a$ can be adjusted by the third resistor element R2$a$ and the sixth resistor element R1$a$.

In addition, the fourth resistor R3$a$ may be connected between the gate terminal and the source terminal of the third switching element Q1$a$. In addition, the fifth resistance element R6$a$ may be connected between the gate terminal and the source terminal of the main switching element Q101. The gate-source voltage of the main switching element Q101 and the third switching element Q1$a$ can be discharged through the fourth resistor R3$a$ and the fifth resistor R6$a$, or the surge voltage can be suppressed, thereby protecting the third switching element.

The diode D1$a$ is connected in the following direction: during the time period (positive period) where the voltage of the AC pulse signal Vg is at a high level, the diode D1$a$ is turned on by the high potential voltage at one end of the secondary coil T1-S1$a$, and the gate voltage Vgs of the main switching element Q101 is set to a high level.

When the voltage of the AC pulse signal Vg is at the reverse level (negative period), the third switching element Q1$a$ is turned on by the high potential voltage at the other end of the secondary coil T1-S1$a$, and the potential of the base terminal of the PNP-type bipolar transistor Q2$a$ is lower than the gate voltage of the main switching element Q101. As a result, the PNP-type bipolar transistor Q2a is turned on, and an operation of lowering the gate voltage Vgs of the main switching element Q101 is performed. If necessary, the resistor R1a that adjusts the rising speed of the gate-source voltage of the main switching element Q101 can also be short-circuited and removed, and the resistor R6a that protects the gate-source voltage of the main switching element Q101 can be open-circuited and removed.

Next, the operating principle of the drive circuit 100 will be described.

When the voltage of the AC pulse signal Vg is at a high level (positive period), the secondary coil T1-S1a induces a positive voltage. This voltage is applied to the gate terminal of the main switching element Q101 via the resistor R1a, the capacitor C1a, and the diode D1a, so that the main switching element Q101 is turned on. Since the drive voltage is a voltage in the positive direction, the second switching element Q2a and the third switching element Q1a are turned off and do not participate in the above operation.

When the voltage of the AC pulse signal Vg is inverted and enters the low-level (negative period), the negative voltage generated in the secondary coil T1_S1a turns on the third switching element Q1a, and changes the base terminal of the PNP-type bipolar transistor Q2a to a low level. As a result, the potential of the base terminal of the PNP-type bipolar transistor Q2a is lower than the potential of the gate of the main switching element Q101, there is current flowing between the emitter and the base of the PNP-type bipolar transistor Q2a, and the emitter and the collector are turned on, and the gate level of the main switching element Q101 is quickly pulled to a low level, thereby reliably turning off the main switching element Q101. If necessary, the resistors R1a and R4a can be short-circuited and removed separately or at the same time, and the resistor R6a can be open-circuited and removed.

Thereby, the charge stored in the input capacitance (between the gate and the source) of the main switching element Q101 can be quickly discharged via the PNP-type bipolar transistor Q2a and the resistors R4a and R5a. By replacing the resistance element (resistance for limiting the base current) with the third switch Q1a to control the on/off of the second switching element Q2a, a low-loss semiconductor switching element drive circuit can be provided.

Figure 3:
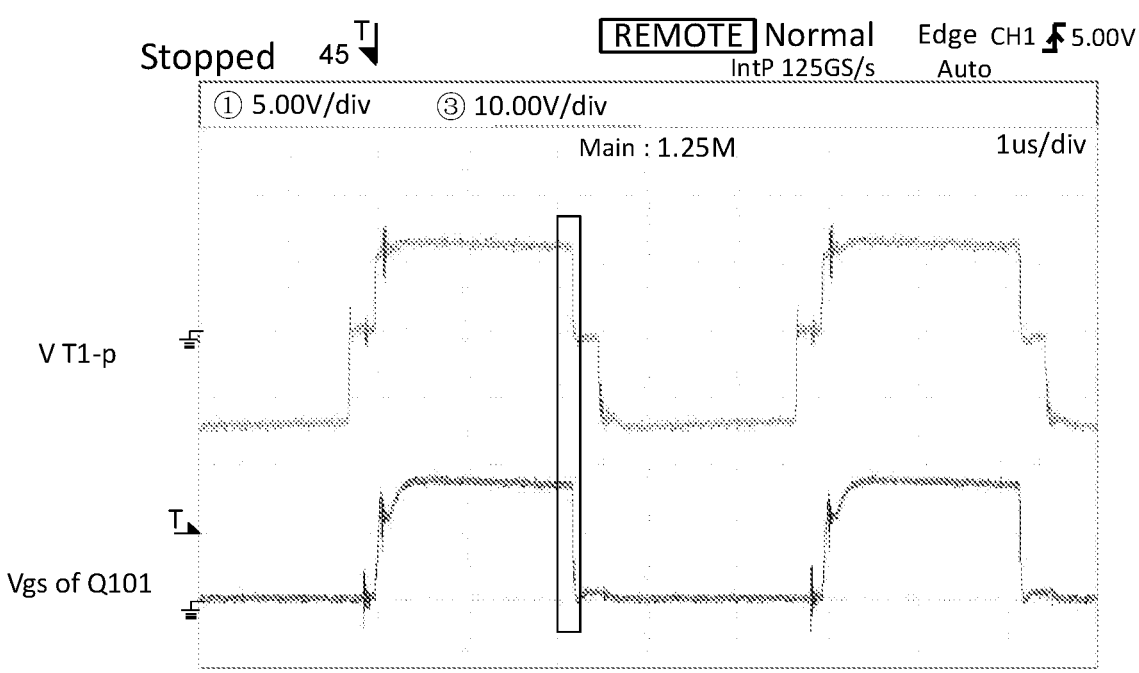
FIG. 3 is an example of a waveform diagram showing the operation of the drive circuit shown in FIG. 2.
Figure 4:
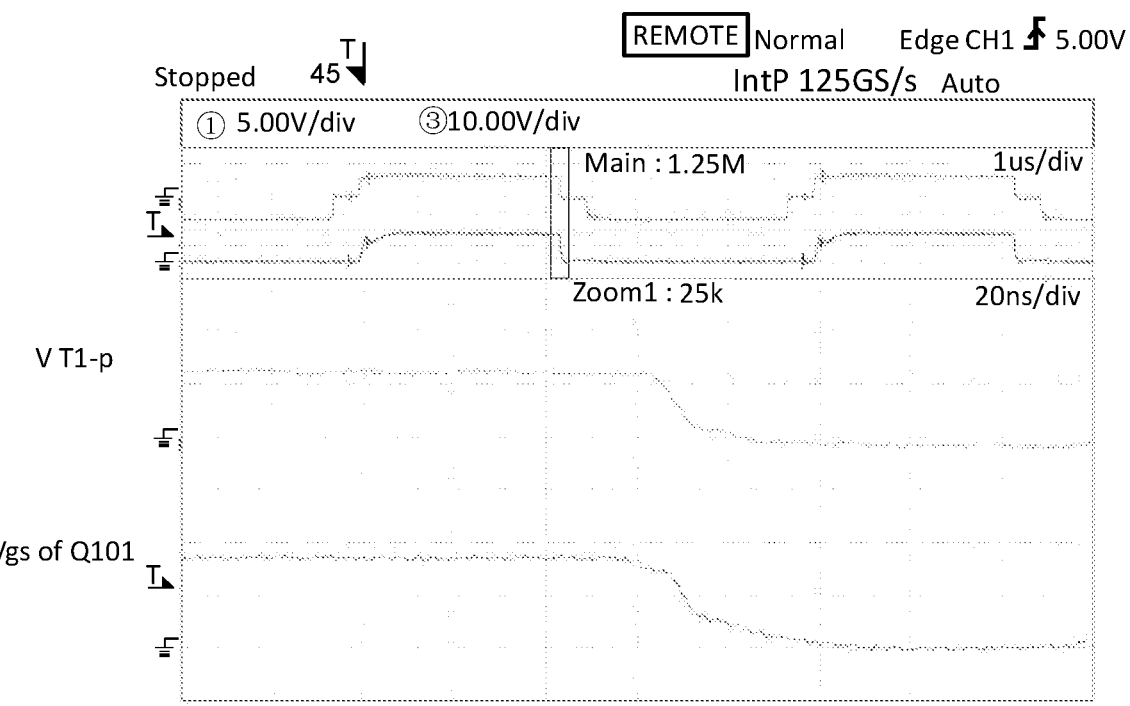
FIG. 4 is an enlarged view of a part of the waveform diagram of FIG. 3.

Next, the effect of discharging the input capacitance of the main switching element Q101 by the drive circuit 100 will be described. FIG. 3 is an example of a waveform diagram showing the operation of the drive circuit shown in FIG. 2, showing the voltage Vgs of the input capacitance (between the source and the gate) of the main switching element Q101 based on the voltage VT1-p generated by the primary coil T1-p of the drive transformer T1. FIG. 4 is an enlarged view of a part surrounded by a frame part near the center part of the waveform diagram of FIG. 3. As can be seen from FIGS. 3 and 4, the period during which the voltage Vgs of the input capacitance (between the source and the gate) of the main switching element Q101 starts to fall to 0V is reduced to approximately 40 ns.

Figure 5:
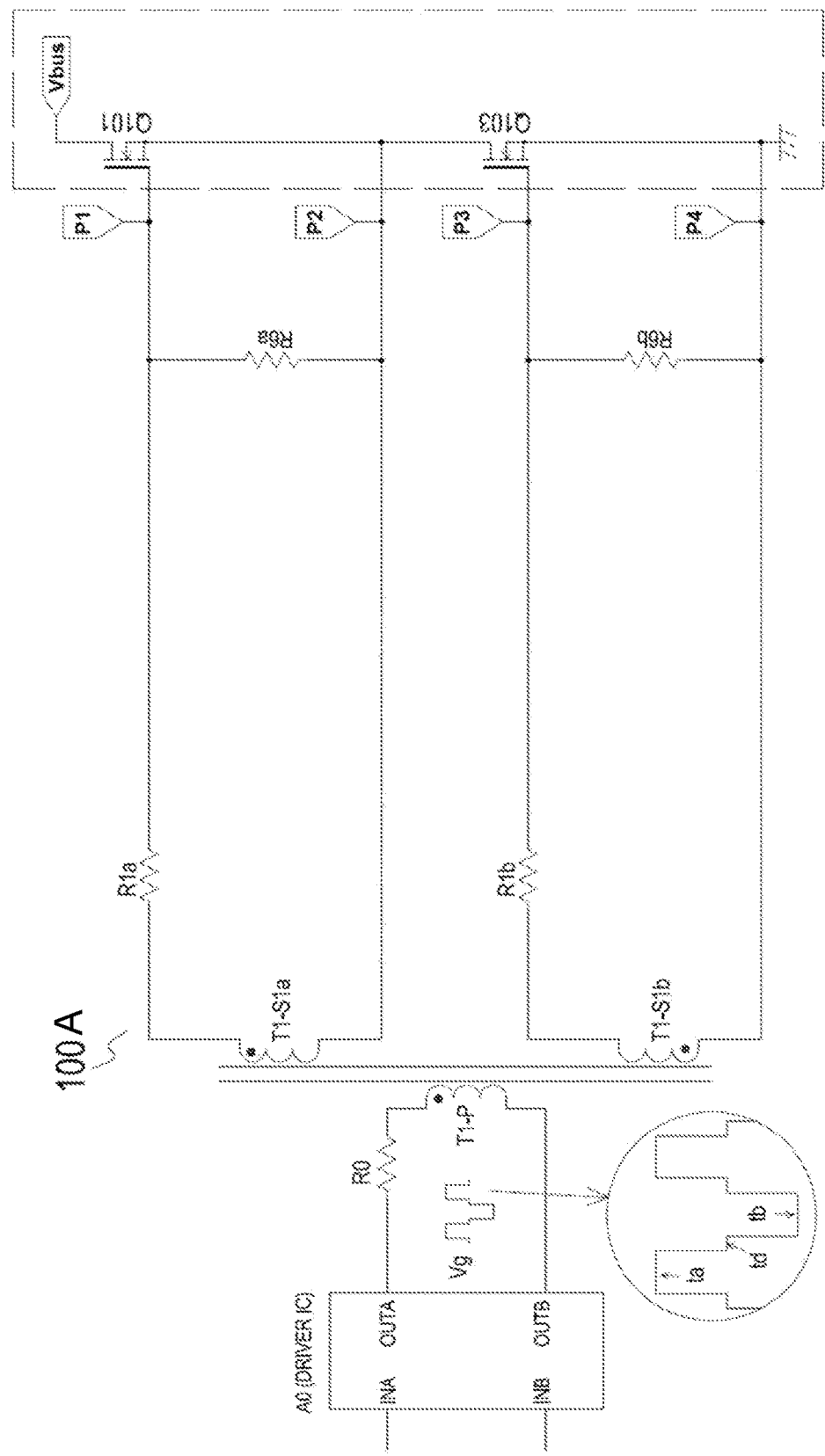
FIG. 5 is a circuit diagram of a drive circuit of a main switching element of a switching power supply device of a comparative example.
Figure 6:
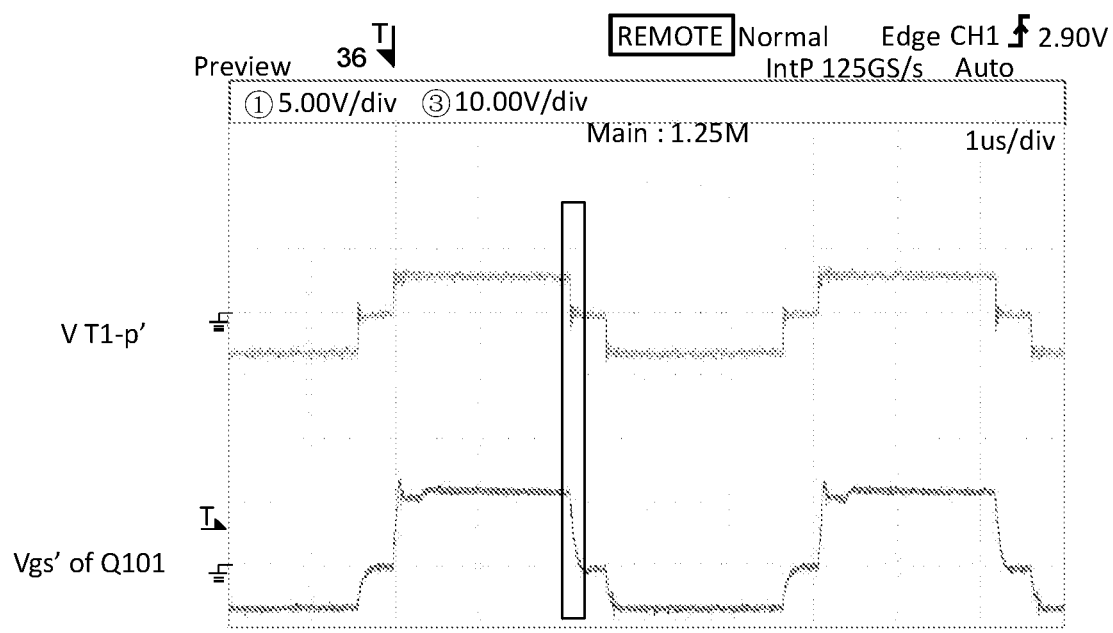
FIG. 6 is an example of a waveform diagram showing the operation of the drive circuit shown in FIG. 5.
Figure 7:
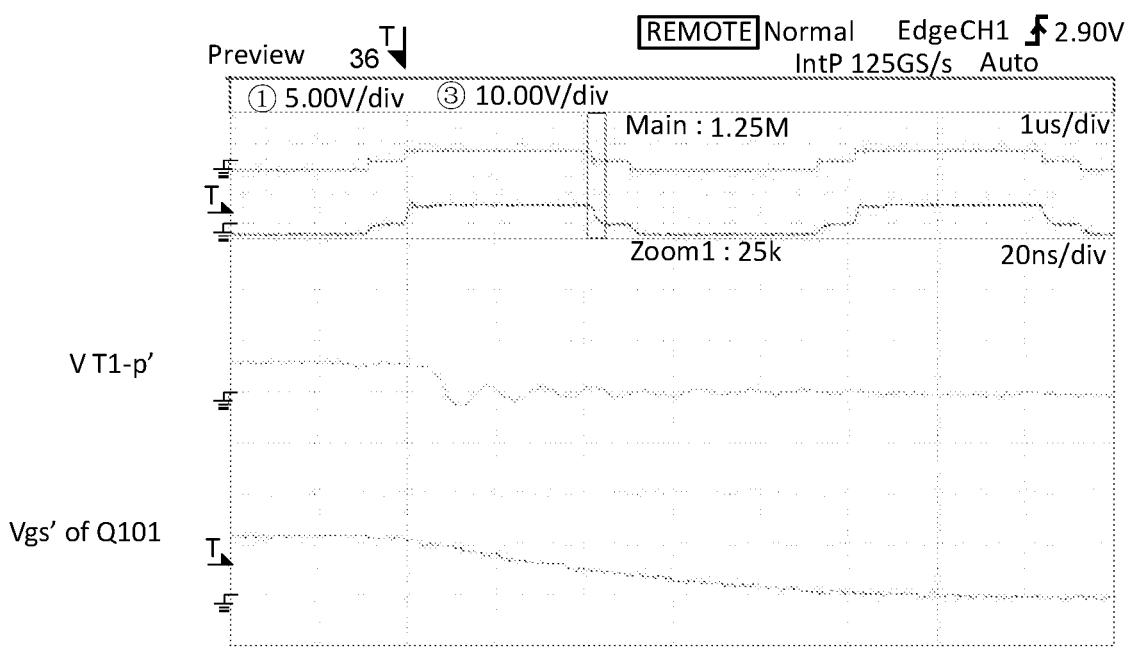
FIG. 7 is an enlarged view of a part of the waveform diagram of FIG. 6.

FIG. 5 is a circuit diagram of a drive circuit 100A of a main switching element of a switching power supply device of a comparative example. Compared with the drive circuit 100 according to the present embodiment, the drive circuit 100A of the comparative example has only the sixth resistor R1a and the fifth resistor element R6a remaining on the secondary side. FIG. 6 is an example of a waveform diagram showing the operation of the drive circuit shown in FIG. 5, showing the voltage Vgs' of the input capacitance (between the source and the gate) of the main switching element Q101 driven by the drive circuit 100A of the comparative example. FIG. 7 is an enlarged view of a part surrounded by a frame near the center part of the waveform diagram of FIG. 6. As can be seen from FIGS. 6 and 7, the period of the voltage Vgs' of the input capacitance (between the source and the gate) of the main switching element Q101 of the comparative example starts to fall to 0V is 100 ns or more.

Therefore, according to the drive circuit of the present invention, even if the input capacitance between the gate and the source of the main switching element of the switching power supply becomes larger, the charge stored in the input capacitance can be discharged quickly, and the loss of the switching element can be reduced. In the drive circuit of the present invention, the fast and reliable turn-off can further reduce the set value of the minimum dead time required by the upper and lower main switching elements, thus reducing the duty cycle loss.

Figure 8:
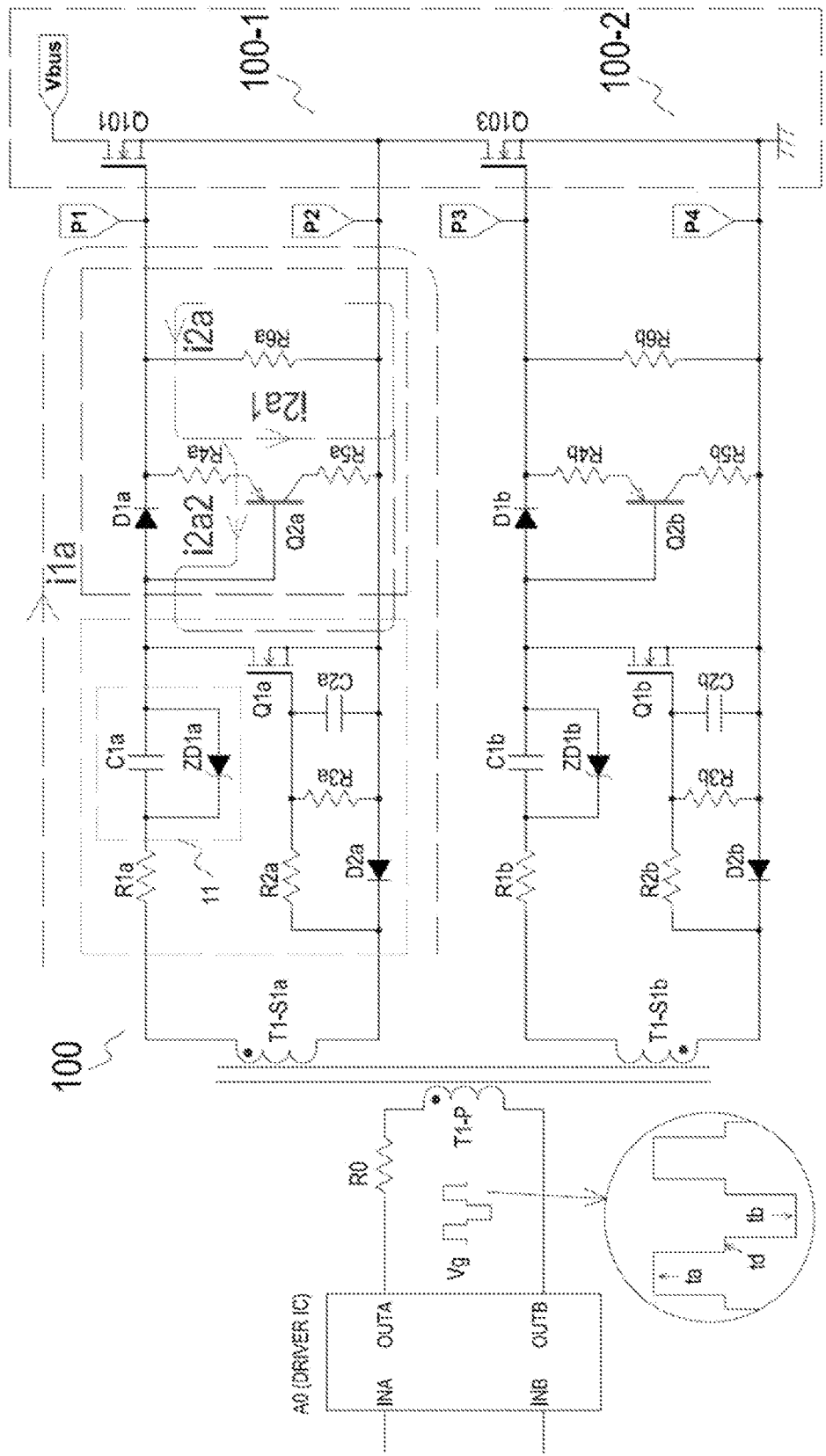
FIG. 8 is a circuit diagram of modified example 1 of the drive circuit of the main switching element (first switching element) of the switching power supply device according to an embodiment of the present invention.

FIG. 8 is a circuit diagram of modified example 1 of the drive circuit of the main switching element (first switching element) of the switching power supply device of the present embodiment. The difference between the modified example 1 and the drive circuit shown in FIG. 2 is that a capacitor C2a (C2b) is connected in parallel at both ends of the fourth resistor R3a (R3b), and the capacitor C2a (C2b) can enhance the effect of noise suppression.

Furthermore, if the drive circuit of the present invention is modified, when the input drive signal is a unidirectional pulse, the drive circuit of the present invention is also applicable (the circuit only needs to increase the capacitor C0). Therefore, the drive circuit of the present invention is not only suitable for AC pulse applications, but also for unidirectional positive pulse driving; it is not only suitable for driving the upper and lower main switching elements of full bridge and half bridge circuits, but also for driving other circuit topologies, such as buck, forward, flyback, and so on.

Figure 9:
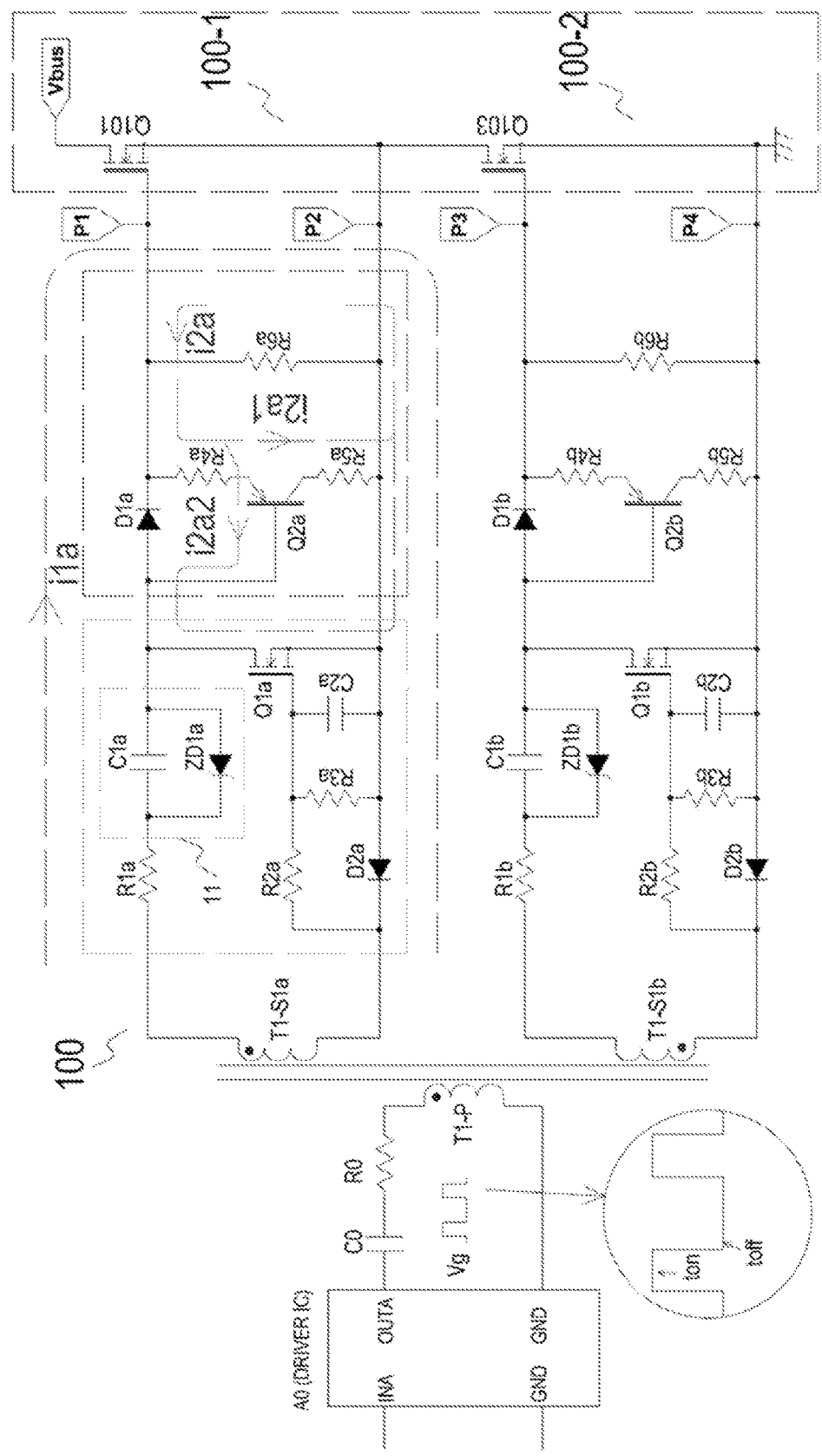
FIG. 9 is a circuit diagram of modified example 2 of the drive circuit of the main switching element (first switching element) of the switching power supply device according to an embodiment of the present invention.

FIG. 9 is a circuit diagram of modified example 2 of the drive circuit of the main switching element (first switching element) of the switching power supply device of the present embodiment. The drive circuit of modified example 2 is a drive circuit whose input is a positive pulse. The drive circuit of modified example 2 can be applied to a positive pulse signal by connecting a capacitor C0 and an input resistance R0 in series.

Figure 10:
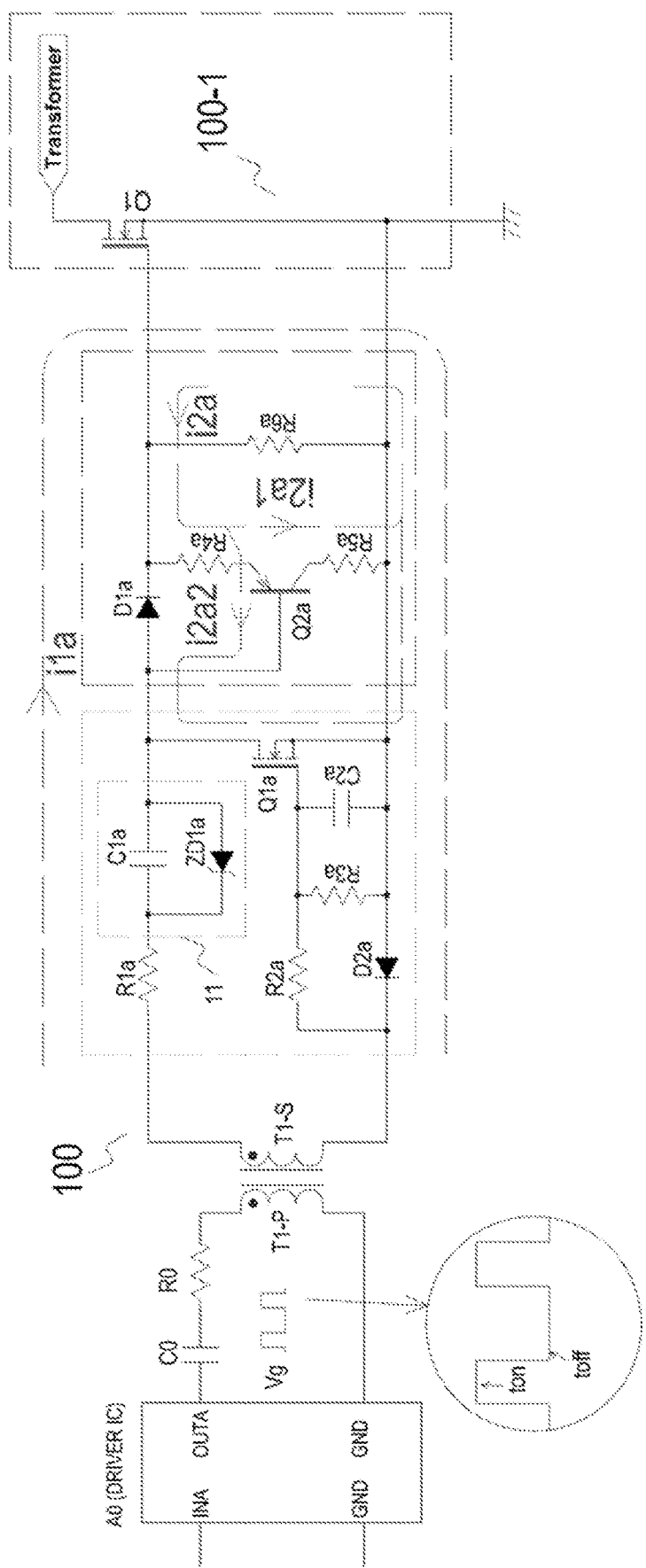
FIG. 10 is a circuit diagram of modified example 3 of the drive circuit of the main switching element (first switching element) of the switching power supply device according to an embodiment of the present invention.
Figure 11:
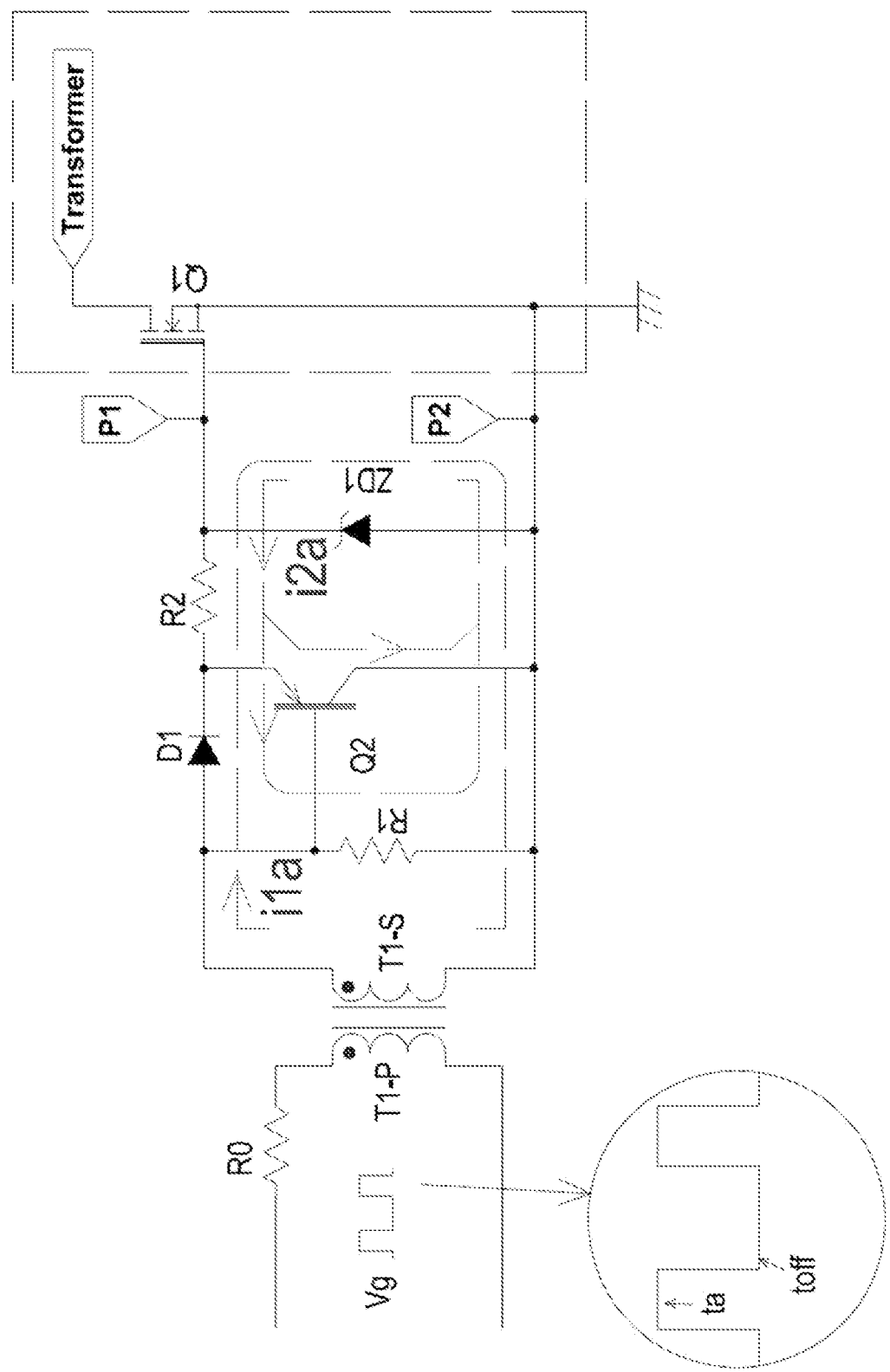
FIG. 11 is a circuit diagram of an example of a drive circuit of a conventional switching power supply device.

FIG. 10 is a circuit diagram of modified example 3 of the drive circuit of the main switching element (first switching element) of the switching power supply device of the present embodiment. The difference between the drive circuit of modified example 3 and modified example 2 is that the drive unit 100-2 is omitted. Therefore, the drive circuit of modified example 3 can be applied to circuit topologies other than the bridge type.

It should be noted that the drive circuit and the switching power supply according to the present invention are not limited to the above-mentioned embodiments, and needless to say, various changes can be made without departing from the gist of the present invention.

The invention claimed is:

1. A drive circuit, which is a drive circuit configured to drive a first switching element, comprising:
   a first diode, a cathode terminal of which is connected to a gate terminal of the first switching element;
   a second switching element, a first terminal of which is connected to an anode terminal of the first diode, a second terminal of which is connected to the gate terminal of the first switching element, a third terminal of which is connected to a source terminal of the first switching element;

a third switching element, a drain terminal of which is connected to the anode terminal of the first diode, and a source terminal of which is connected to the source terminal of the first switching element;

a parallel circuit, one end of which is connected to a cathode terminal of a Zener diode and one end of a capacitor, and the other end is connected to an anode terminal of the Zener diode and the other end of the capacitor; and a drive transformer having a coil, one end of the coil is connected to the drain terminal of the third switching element via the parallel circuit, the other end of the coil is connected to a gate terminal of the third switching element, and is connected to the source terminal of the third switching element via a second diode, wherein one end of the parallel circuit is connected to one end of the coil, a cathode terminal of the second diode is connected to the other end of the coil, and at least one of the connection between the second terminal and the gate terminal of the first switching element and the connection between the third terminal and the source terminal of the first switching element is connected via a resistor.

2. The drive circuit according to claim 1,
wherein the second switching element is a PNP-type bipolar transistor, the first terminal is a base terminal, the third terminal is a collector terminal, and the second terminal is an emitter terminal.

3. A power supply device comprising the drive circuit according to claim 2.

4. The drive circuit according to claim 1,
wherein the second switching element is a P-channel type FET, the first terminal is a gate terminal, the third terminal is a drain terminal, and the second terminal is a source terminal.

5. A power supply device comprising the drive circuit according to claim 4.

6. The drive circuit according to claim 1,
wherein a first resistance element is connected between the gate terminal of the first switching element and the second terminal of the second switching element.

7. A power supply device comprising the drive circuit according to claim 6.

8. The drive circuit according to claim 1,
wherein a second resistance element is connected between the source terminal of the first switching element and the third terminal of the second switching element.

9. A power supply device comprising the drive circuit according to claim 8.

10. The drive circuit according to claim 1,
wherein a third resistance element is connected between the gate terminal of the third switching element and the other end of the coil.

11. A power supply device comprising the drive circuit according to claim 10.

12. The drive circuit according to claim 1,
wherein a fourth resistance element is connected between the gate terminal and the source terminal of the third switching element.

13. A power supply device comprising the drive circuit according to claim 12.

14. The drive circuit according to claim 1,
wherein a second capacitor is connected between the gate terminal and the source terminal of the third switching element.

15. A power supply device comprising the drive circuit according to claim 14.

16. The drive circuit according to claim 1,
wherein a fifth resistance element is connected between the gate terminal and the source terminal of the first switching element.

17. A power supply device comprising the drive circuit according to claim 16.

18. The drive circuit according to claim 1,
wherein a sixth resistance element is connected between the one end of the parallel circuit and the one end of the coil.

19. A power supply device comprising the drive circuit according to claim 18.

20. A power supply device comprising the drive circuit according to claim 1.

* * * * *